United States Patent
Lee et al.

(10) Patent No.: US 6,774,465 B2
(45) Date of Patent: Aug. 10, 2004

(54) SEMICONDUCTOR POWER PACKAGE MODULE

(75) Inventors: Keun hyuk Lee, Seongbuk-gu (KR); Ji-hwan Kim, Gochuk-dong Guro-gu (KR); Dae-woong Chung, Bucheon (KR); O-seob Jeon, Seodaemun-gu (KR)

(73) Assignee: Fairchild Korea Semiconductor, Ltd. (KR)

( * ) Notice: Subject to any disclaimer, the term of this patent is extended or adjusted under 35 U.S.C. 154(b) by 0 days.

(21) Appl. No.: 10/265,081

(22) Filed: Oct. 4, 2002

(65) Prior Publication Data

US 2003/0085456 A1 May 8, 2003

Related U.S. Application Data

(60) Provisional application No. 60/327,609, filed on Oct. 5, 2001.

(30) Foreign Application Priority Data

Nov. 8, 2001 (KR) .................................. 10-2001-0069490

(51) Int. Cl.$^7$ ......................... H01L 23/495; H01L 23/02
(52) U.S. Cl. ....................... 257/671; 257/678; 257/704; 257/780; 257/781; 257/784
(58) Field of Search .................................. 257/671, 678, 257/704, 780, 781, 784

(56) References Cited

U.S. PATENT DOCUMENTS

| | | | | |
|---|---|---|---|---|
| 5,347,160 A | * | 9/1994 | Sutrina ........................ 257/688 |
| 5,471,089 A | | 11/1995 | Nagatomo et al. |
| 5,497,291 A | * | 3/1996 | Hosen ......................... 361/804 |
| 5,513,072 A | | 4/1996 | Imaji et al. |
| 5,519,252 A | * | 5/1996 | Soyano et al. ............... 257/690 |
| 5,521,437 A | * | 5/1996 | Oshima et al. .............. 257/701 |
| 5,543,659 A | * | 8/1996 | Hosen ......................... 257/692 |
| 5,661,343 A | * | 8/1997 | Takahashi et al. ........... 257/723 |
| 5,703,399 A | | 12/1997 | Majumdar et al. |
| 5,747,875 A | * | 5/1998 | Oshima ....................... 257/687 |
| 5,920,119 A | * | 7/1999 | Tamba et al. ................ 257/718 |
| 5,942,797 A | * | 8/1999 | Terasawa ..................... 257/723 |
| 6,144,571 A | * | 11/2000 | Sasaki et al. ................ 257/678 |
| 6,421,244 B1 | * | 7/2002 | Shinohara et al. ........... 361/736 |
| 6,525,950 B1 | * | 2/2003 | Shirakawa et al. .......... 363/144 |
| 6,597,063 B1 | * | 7/2003 | Shimizu et al. .............. 257/687 |
| 2003/0015778 A1 | * | 1/2003 | Soyano et al. ............... 257/678 |

FOREIGN PATENT DOCUMENTS

| | | | | |
|---|---|---|---|---|
| JP | 54-128269 | | * 10/1979 | ................. 257/723 |
| JP | 63-246855 | | * 10/1988 | ................. 257/712 |
| JP | 5259373 A | | 10/1993 | |
| JP | 08-188363 A | | 7/1994 | |
| JP | 2000-077602 A | | 3/2000 | |
| JP | 2000088446 A | | 3/2000 | |

* cited by examiner

Primary Examiner—Jasmine Clark
(74) Attorney, Agent, or Firm—Townsend and Townsend and Crew LLP

(57) ABSTRACT

A semiconductor power module in which a power circuit chip and a control circuit chip are integrated in a package, is provided. The semiconductor power module includes a case; a terminal inserted into the case, the terminal including portions protruding upward to the outside of the case, and portions exposed in the case; a first substrate to which the power circuit chip is attached, the first substrate attached to the case for encapsulating the bottom of the package; a second substrate to which the control circuit chip is attached, the second substrate being spaced from the first substrate at a predetermined interval in a perpendicular direction in the case; and a cover for covering the top of the case, and for encapsulating the top of the package.

14 Claims, 11 Drawing Sheets

SEMICONDUCTOR POWER PACKAGE MODULE

CROSS-REFERENCE TO RELATED APPLICATIONS

This application claims the benefit of U.S. Provisional Patent Application No. 60/327,609, filed on Oct. 5, 2001. The U.S. Provisional Patent Application is herein incorporated by reference in its entirety.

BACKGROUND OF THE INVENTION

1. Field of the Invention

The present invention relates to a semiconductor module, and more particularly, to a semiconductor power package module in which a power circuit and a control circuit are assembled in a package.

2. Description of the Related Art

Advancement in the power electronics industry, e.g., inverters and servo drivers, triggers a need for a light and compact power system that is manufactured at a low cost and operates more efficiently. To realize such a power system, various power semiconductor chips are integrated into one package, i.e., a power semiconductor module, and a large number of power devices and control integrated circuits (IC), which control the integrated power semiconductor chips, are integrated into one power semiconductor module that is capable of controlling and protecting power devices. The power semiconductor module is called an 'intelligent semiconductor power module'.

FIG. 1 is a cross-sectional view of an example 10 of conventional semiconductor power modules. In FIG. 1, reference numerals 11, 13, 15, 17 and 19 denote a case, control circuit terminal, a main circuit terminal, a main circuit part and a control circuit part, respectively.

As shown in FIG. 1, in the semiconductor power module 10, all components are attached to an insulating metal substrate 16 and they are connected to one another via a bonding wire 18. The size of the semiconductor power module 10 is determined by the size of the insulating metal substrate 16 to which all the components are attached. Thus, the more the components attached to the insulating metal substrate 16 are, the bigger the semiconductor power module 10 is, thereby increasing the volume of materials therefor such as the insulating metal substrate 16 and a molding material, and manufacturing costs.

FIG. 2 is a cross sectional view of another example 20 of a conventional semiconductor power module. Here, reference numerals '21' and '29' denote a terminal and a case, respectively.

Referring to FIG. 2, a main circuit part 25 having a power semiconductor device, and a control circuit part 23 having a control circuit device are formed on different substrates that are separated each other in the perpendicular direction. In detail, the main circuit part 25 is attached to a lower substrate, and the control circuit part 23 is attached to an upper substrate. The main circuit part 25 and the control circuit part 23 are connected to each other via connection metal 27. The portions where the connection metals 27 are in contact with the main circuit part 25 and the control circuit part 23, are soldered by solder deposits 22.

In this conventional power semiconductor device, since the main circuit part 25 and the control circuit part 23 are placed on different upper and lower substrates, the connection metals 27, and the solder deposits 22 are additionally required for connecting the main circuit part 25 and the control circuit part 27. Therefore, the conventional power semiconductor device is not easy to manufacture, and further, manufacturing costs are increased.

SUMMARY OF THE INVENTION

To solve the above problems, it is desirable to provide a semiconductor power module, which can be made smaller, and which does not require additional connections for connecting a power circuit and a control circuit part.

One embodiment of the invention is directed to a semiconductor power module in which a power circuit chip and a control circuit chip are integrated in a package, the semiconductor power module comprising: a case; a terminal inserted into the case, the terminal including a portion protruding upward to the outside of the case, and a portion exposed in the case; a first substrate to which the power circuit chip is attached, the first substrate attached to the case forming the bottom of the package; a second substrate to which the control circuit chip is attached, the second substrate spaced from the first substrate at a predetermined interval in the perpendicular direction in the case; and a cover for covering the top of the case, and forming the top of the package.

Preferably, the case is made of a plastic material.

Preferably, the terminal is made of a copper material that is electroplated with nickel.

Preferably, the first substrate and the power circuit chip, and the first substrate and the control circuit chip are electrically connected to each other via wires, respectively. Preferably, the wires, which connect the first substrate and the power circuit chip each other, are aluminum wires, and the wires, which connect the second substrate and the control circuit chip each other, are gold wires or aluminum wires.

Preferably, the first substrate and the power circuit chip are electrically connected to the exposed portions of the terminal via wires, respectively. At this time, preferably, the wires, which electrically connect the first substrate, and the power circuit chip to the exposed portions of the terminal, are aluminum wires.

Preferably, the first substrate and the power circuit chip are electrically connected to the exposed portions of the terminal via wires, respectively.

Preferably, the second substrate and the exposed portions of the terminal are electrically connected to each other via wires. Also, preferably, the wires, which connect the second substrate to the exposed portions of the terminal, are aluminum wires.

Preferably, the first substrate is a stacked structure in which a copper layer, a ceramic layer and a copper layer are sequentially deposited.

Preferably, the second substrate is a print circuit board.

Preferably, the semiconductor power module further includes a silicon gel (e.g., a silicone gel) for filling the inside of the package.

BRIEF DESCRIPTION OF THE DRAWINGS

The above aspects of embodiments of the invention will become more apparent by describing in detail a preferred embodiment thereof with reference to the attached drawings in which.

DETAILED DESCRIPTION

Figure 1:
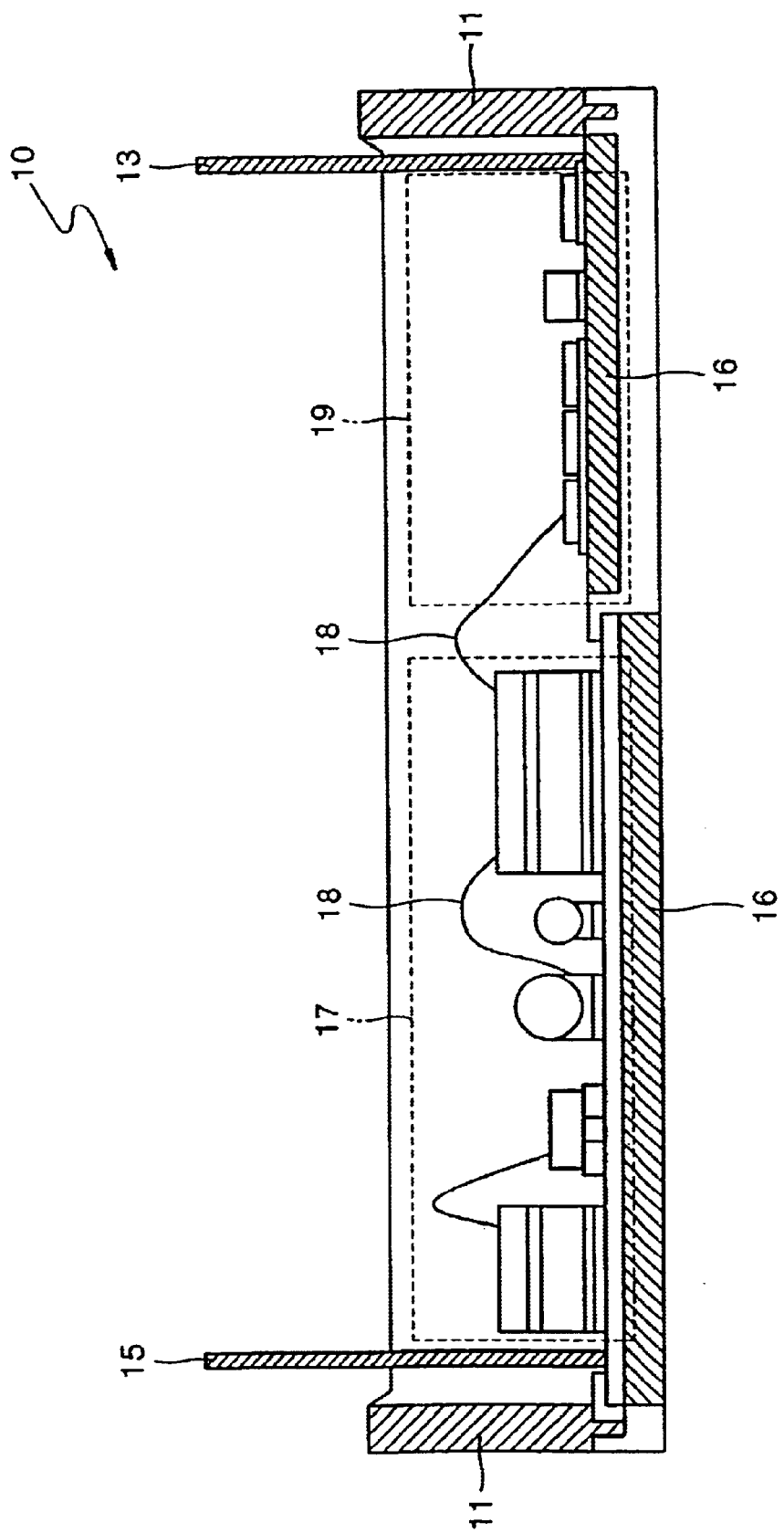
FIG. 1 is a cross sectional view of an example of a conventional semiconductor power module.
Figure 2:
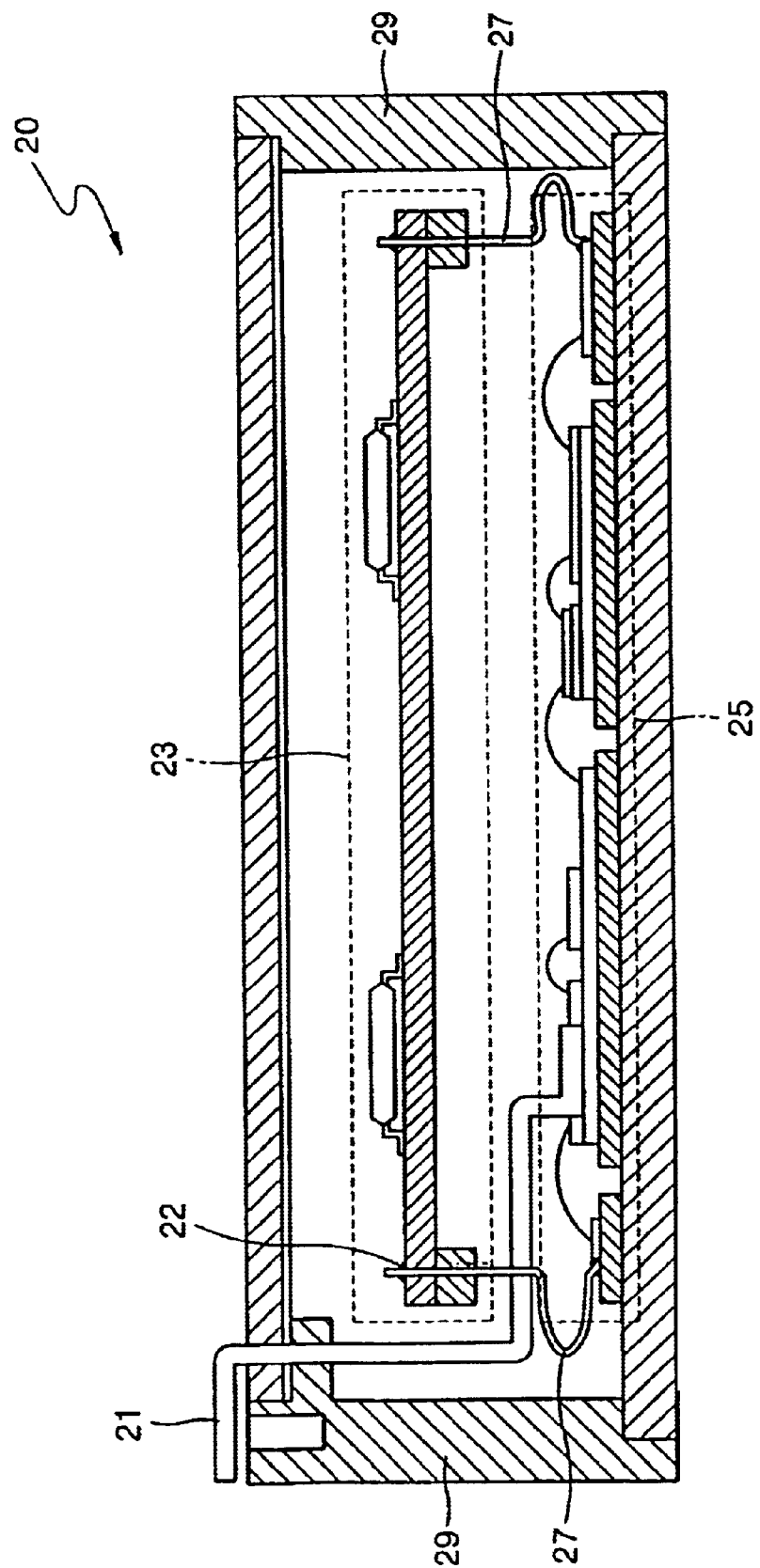
FIG. 2 is a cross sectional view of another example of a conventional semiconductor power module.

Embodiments of the invention now will be described more fully with reference to the accompanying drawings, in which a preferred embodiment of the invention is shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. The same reference numerals in different drawings represent the same element, and thus their description will be omitted.

Figure 3:
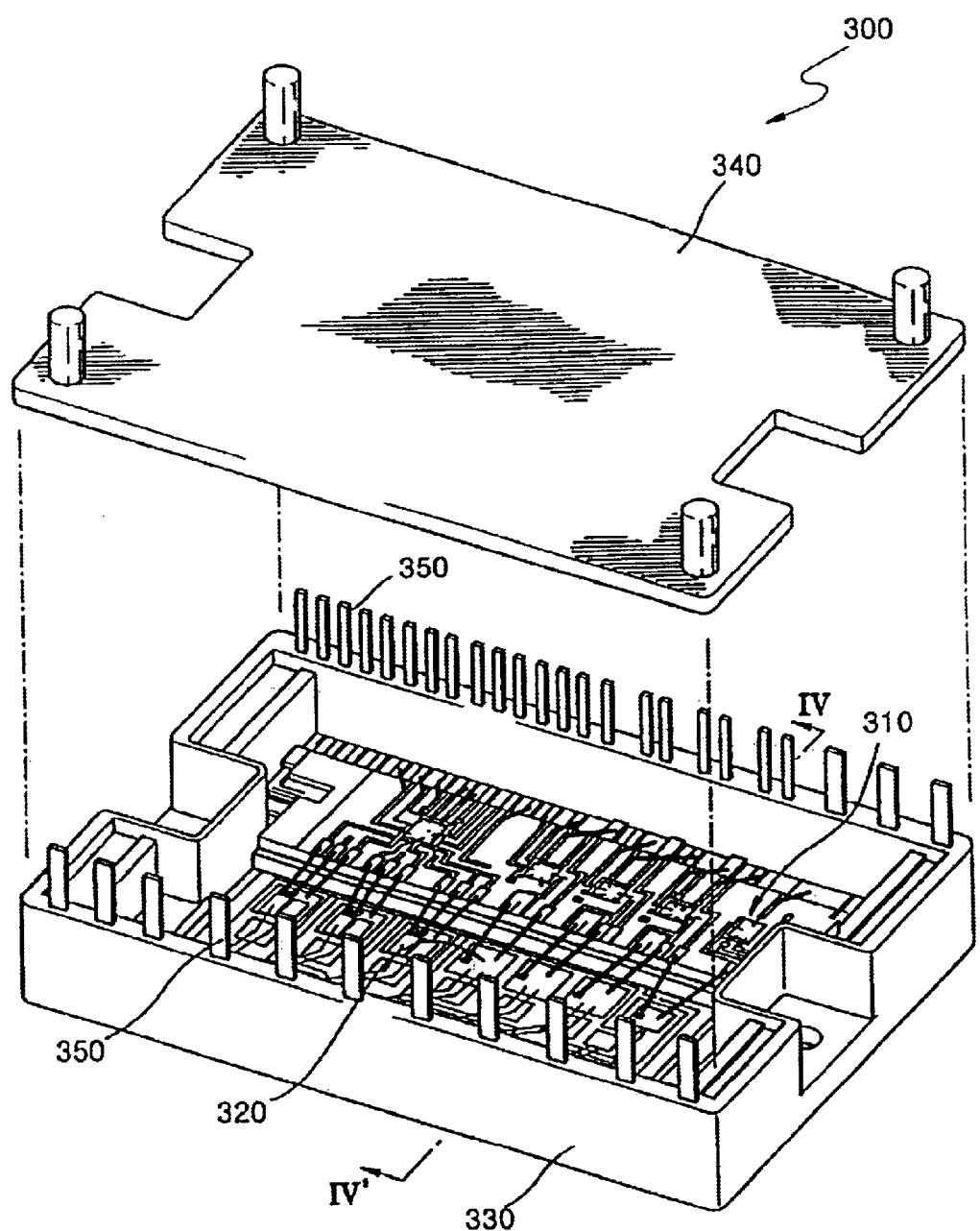
FIG. 3 is an exploded perspective view of a semiconductor power module according to an embodiment of the present invention.
Figure 4:
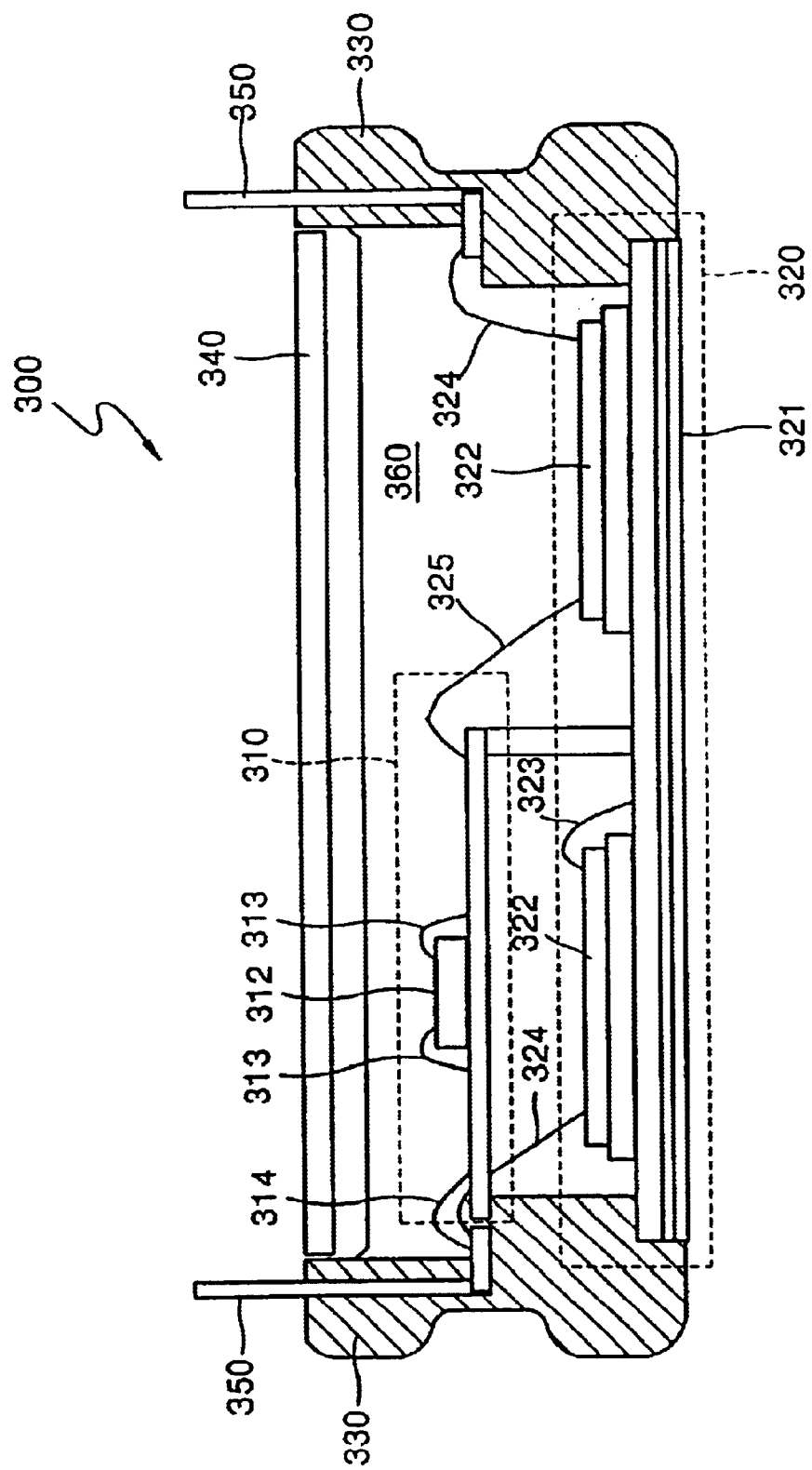
FIG. 4 is a cross sectional view of the semiconductor power module of FIG. 3, taken along the line IV–IV'.

As shown in FIGS. 3 and 4, in a semiconductor power module 300 (hereinafter, "package 300"), a control circuit part 310 and a power circuit part 320 are entirely enclosed by a case 330 and a cover 340. The control circuit part 310 is placed to be separated from the power circuit part 320 at a predetermined distance in the perpendicular direction, but is overlapped with a portion of the power circuit part 320. The control circuit part 310 and the power circuit part 320 are connected to each other or to a copper terminal 350, which is positioned outside them via general wires 312, 324 and 325, and thus, no additional connections are required. Also, the control circuit part 310 is placed to be overlapped with a portion of the power circuit part 320 above the power circuit part 320, thereby reducing the size of the package 300.

Figure 5:
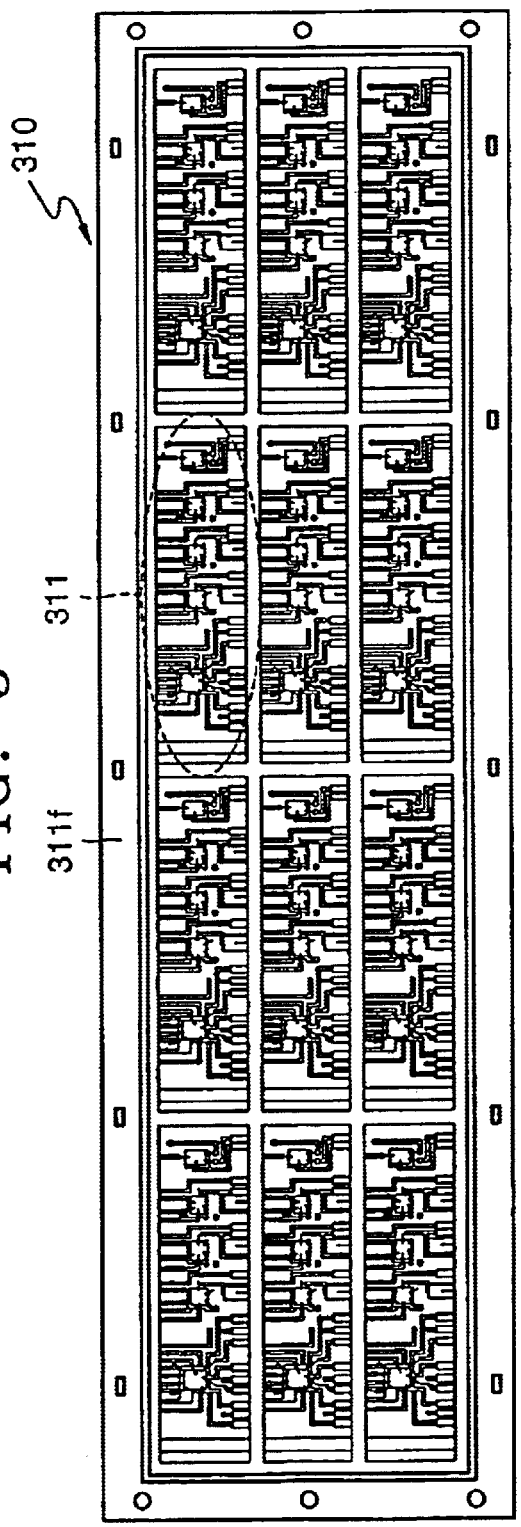
FIG. 5 is a plan view of the semiconductor power module of FIG. 3.
Figure 6:
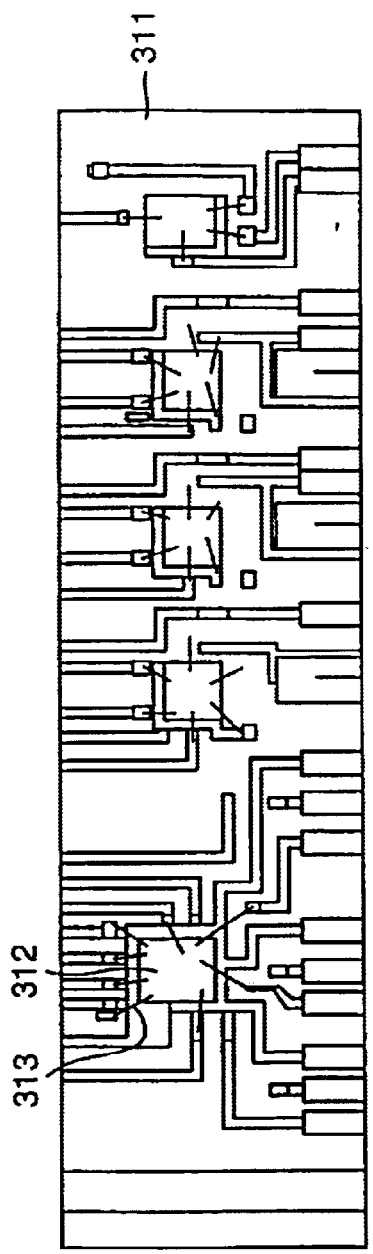
FIG. 6 is a plan view of a unit print circuit board of a control circuit part of FIG. 5.

As shown in FIG. 5, the control circuit part 310 has a structure in which a plurality of unit print circuit boards 311, which are separated from one another, are attached to one print circuit board frame 311f. However, the control circuit part 310 may be composed of only one unit print circuit board 311. As shown in FIGS. 4 and 6, a control circuit chip 312 is attached to each print circuit board 311. The control circuit chip 312 is electrically connected to the unit print circuit board 311 via wires 313. The control circuit chip 312 may include passive devices, and is attached to each print circuit board 311 via silver (Ag) epoxy or solder (not shown). On the other hand, preferably, gold (Au) wires or aluminum (Al) wires are used as the wires 313 that electrically connect the control circuit chip 312 and the print circuit board 311. Meanwhile, the unit print circuit boards 311 are also electrically connected to the copper terminals 350, which protrude to the outside of the package 300, passing through the case 330, via the wires 314. The copper terminals 350 are electroplated with nickel. Preferably, the wires 314, which electrically connect the unit print circuit boards 311 and the copper terminals 350, are aluminum (Al) wires.

Figure 7:
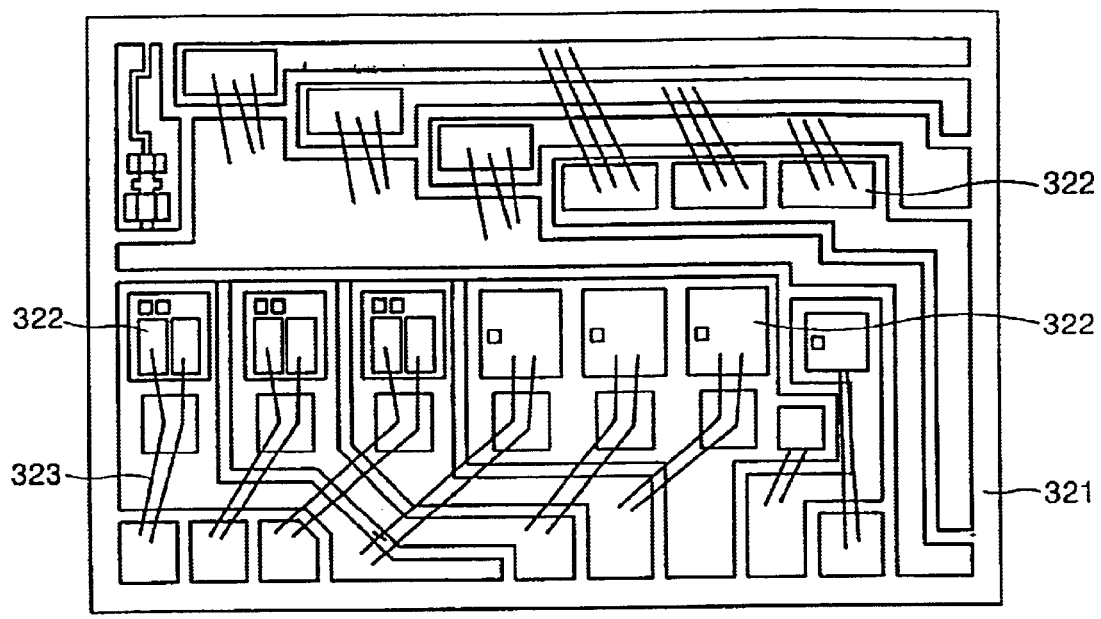
FIG. 7 is a plan view of the semiconductor power module of FIG. 3.

As shown in FIGS. 4 and 7, the power circuit part 320 has a structure in which power circuit chips 322 are attached to a direct bond copper (DBC) substrate 321 as shown in FIGS. 4 and 7. Preferably the DBC substrate 321 is made by depositing a copper layer, a ceramic layer and a copper layer sequentially. Power circuit chips 322 are electrically connected to the DBC substrate 321 via the wire 323. Preferably, the wire 323 is formed of aluminum. Also, the power circuit chips 322 are electrically connected to the copper terminals 350 that protrudes to the outside of the package 300, passing through the case 330. Preferably, the wires 324 and 325 are formed of aluminum.

Meanwhile, the package 300 is filled with silicon gel 360 and thus capable of protecting the control circuit chip 312 and the power circuit chip 322 from environmental or thermal stress.

Figure 8:
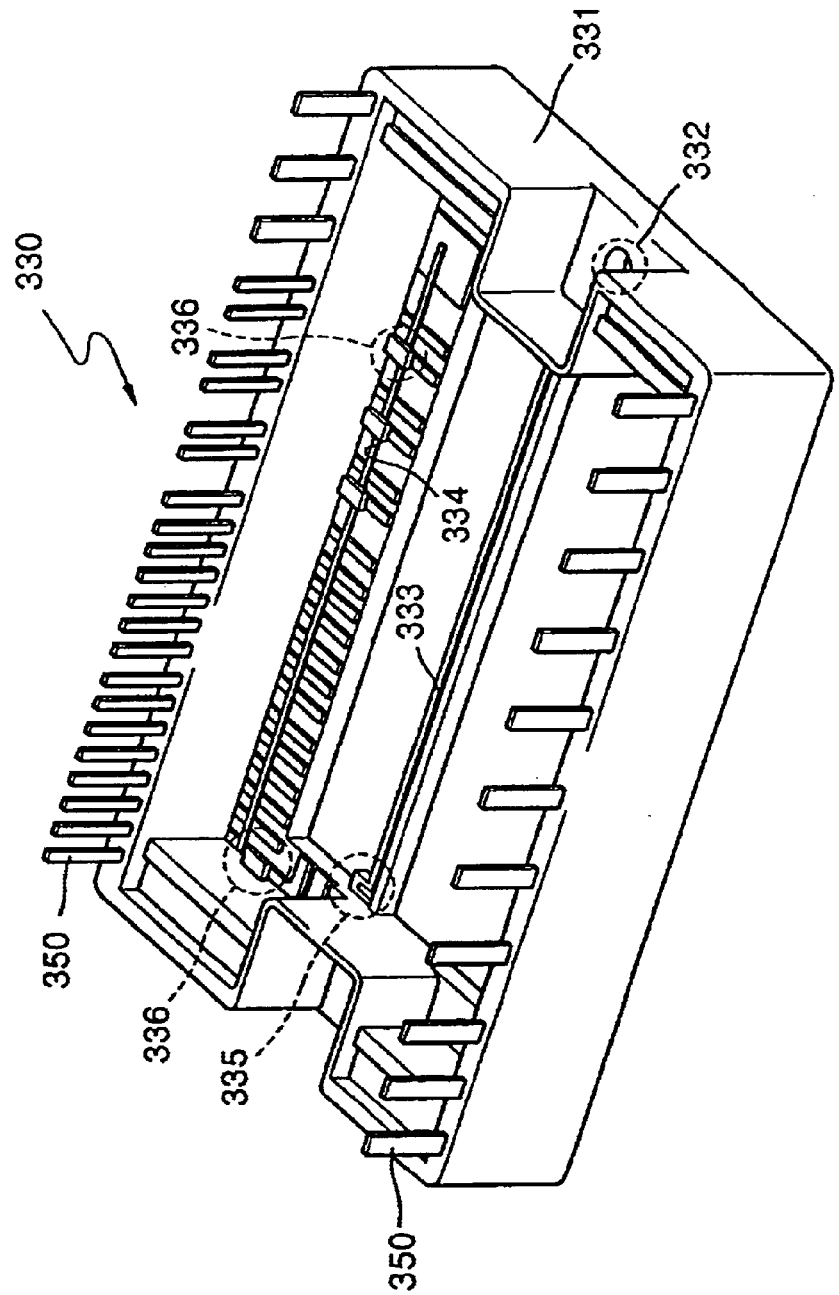
FIG. 8 is a perspective view of a case of the semiconductor power module of FIG. 3.
Figure 9:
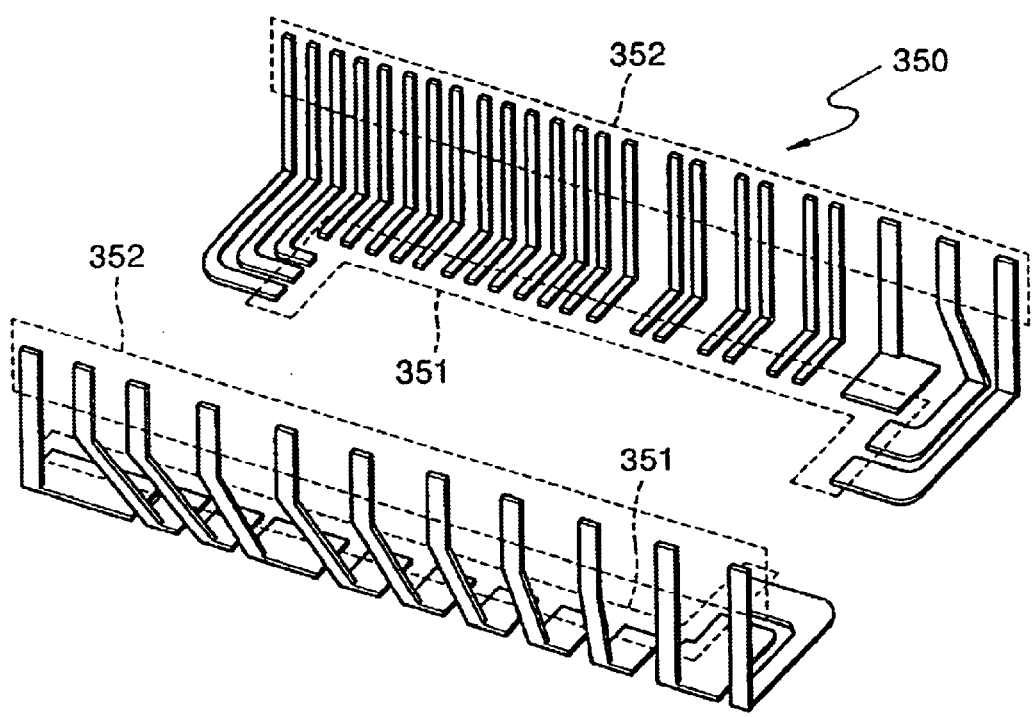
FIG. 9 is a perspective view of a copper terminal inserted into the case of FIG. 8.

FIG. 8 is a perspective view of a case 330 adopted in a semiconductor power module according to the present invention, and FIG. 9 is a perspective view of copper terminals 350 inserted into the case 330 of FIG. 8. Referring to FIG. 8, the case 330 is a plastic case defined by an outer wall 331, and its top and bottom are open. As previously mentioned, the bottom and top of the case 330 are formed by the DBC substrate 321 of FIG. 4 and the cover 340 of FIGS. 3 and 4, respectively. Thus, the case 330 has an assembly region 332 through which the case 330 can be assembled with the cover 340. In the event that the case 330 is assembled with the cover 340 via bolts and nuts, bolt holes may be formed in the assembly region 332. Further, a first bar 333 is placed across the central bottom of the case 330, and a second bar 334 is placed on the copper terminals 350 on a side of the bottom of the case 330. These first and second bars 333 and 334 support both ends of the print circuit board 311 in the control circuit part 310. Also, protrusions 335 and 336 are formed on the surfaces of the first and second bars 333 and 334, respectively, thereby preventing the swaying of the print circuit board 311.

At the top of sidewalls 331 of the case 330, which are facing each other, the copper terminals 350 protrude to the outside of the package 300. Each copper terminal 350 includes a portion 351 exposed in the package 300, and a portion 352 protruding to the outside as shown in FIG. 9. The other portion of each copper terminal 350 is inserted into the case 330. The portion 351 is electrically connected to the control circuit part 330 and the power circuit part 320 via wires.

Figure 10:
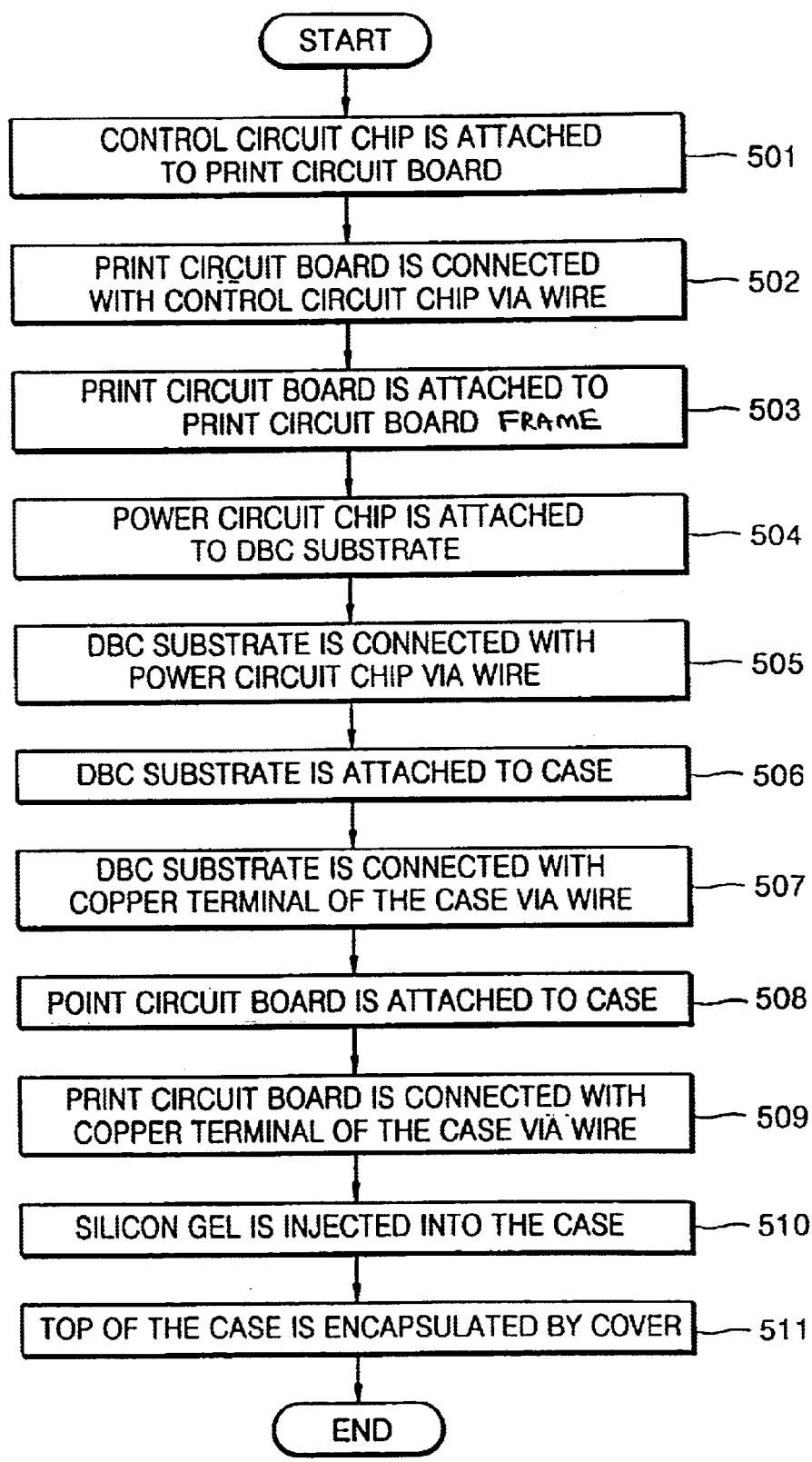
FIG. 10 is a flow chart for explaining a method of manufacturing a semiconductor power module according to an embodiment of the present invention.
Figure 11:
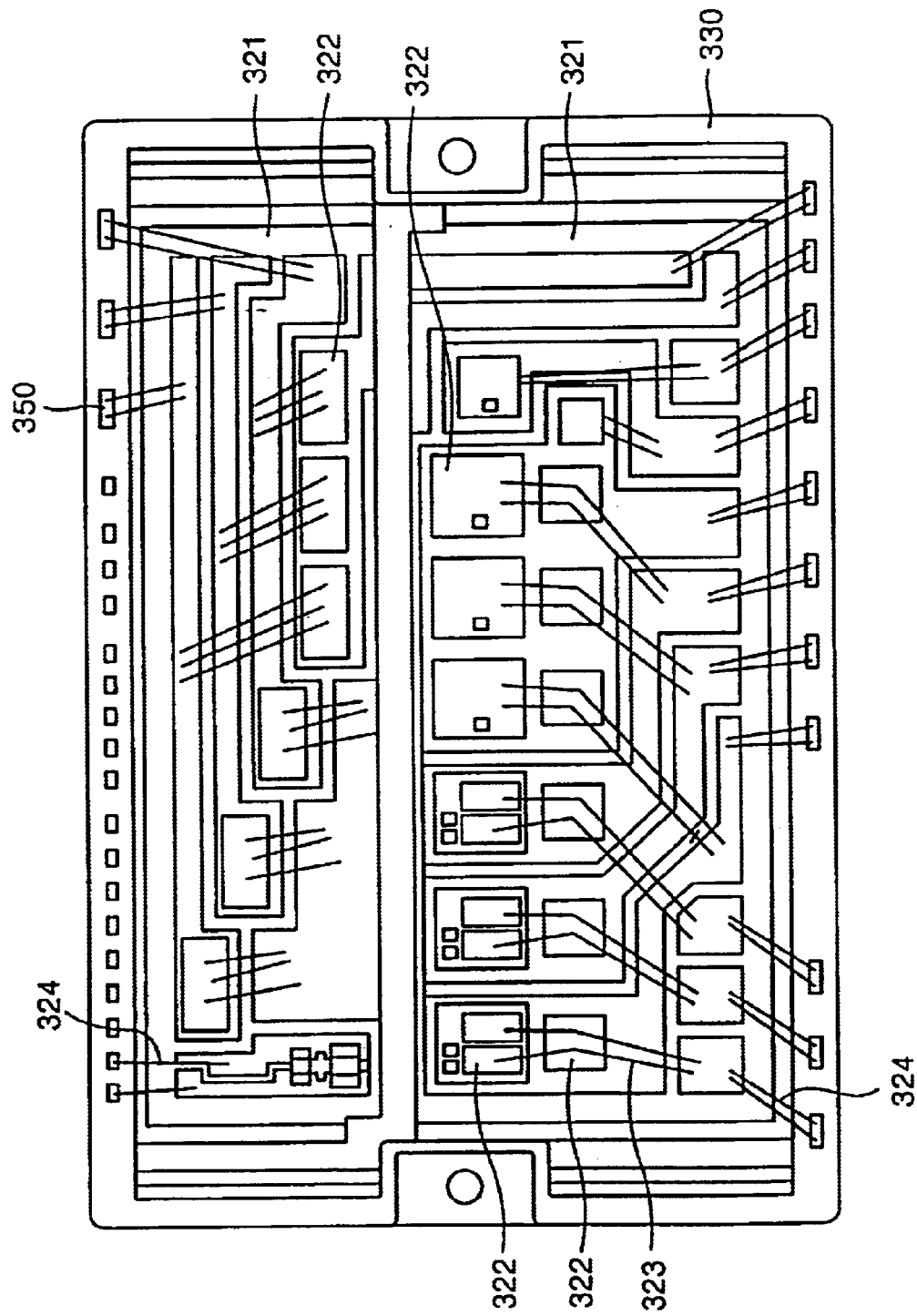
FIG. 11 is a view for explaining the steps 506 and 507 illustrated in FIG. 10.

FIG. 10 is a flow chart for explaining a method of fabricating a semiconductor power module according to an embodiment of the present invention. FIG. 11 is a view for explaining the steps 506 and 507 of FIG. 10, and FIG. 12 is a view for explaining the steps 508 and 509 of FIG. 10.

Referring to FIG. 10, the control circuit chip 312 is attached to the print circuit board 311 as shown in FIG. 6 (step 501). At this time, epoxy or solder can be used to attach the control circuit chip 312 to the print circuit board 311. Next, the print circuit board 311 and the control circuit chip 312 are connected each other via the wires 313 by a wire bonding process (step 502). Preferably, the wires 313 are gold wires. Then, as shown in FIG. 5, a plurality of print circuit boards 311 are attached to the print circuit board frame 311f at predetermined intervals (step 503). Step 503 can be omitted in some embodiments.

Thereafter, as shown in FIG. 7, the power circuit chip 322 is attached to the DBC substrate 311 (step 504). At this time, solder can be used to attach the power circuit chip 322 to the DBC substrate 321. Next, the DBC substrate 321 and the power circuit chip 322 are connected to each other via the wires 323 by a wire bonding process (step 505). Preferably, the wires 323 are aluminum wires. Then, as shown in FIG. 11, the DBC substrate 321 is attached to the case 330, thereby completely covering the bottom of the package 300 (step 506). The DBC substrate 321 may be attached to the case 330 via an adhesive such as a silicone adhesive. Then, the DBC substrate 321 is connected to the copper terminals 350, which is exposed within the case 330, via the wires 324 (step 507). Preferably, the wires 324 are aluminum wires. It is possible to individually perform the steps 501 through 503, and the steps 504 and 505.

Figure 12:
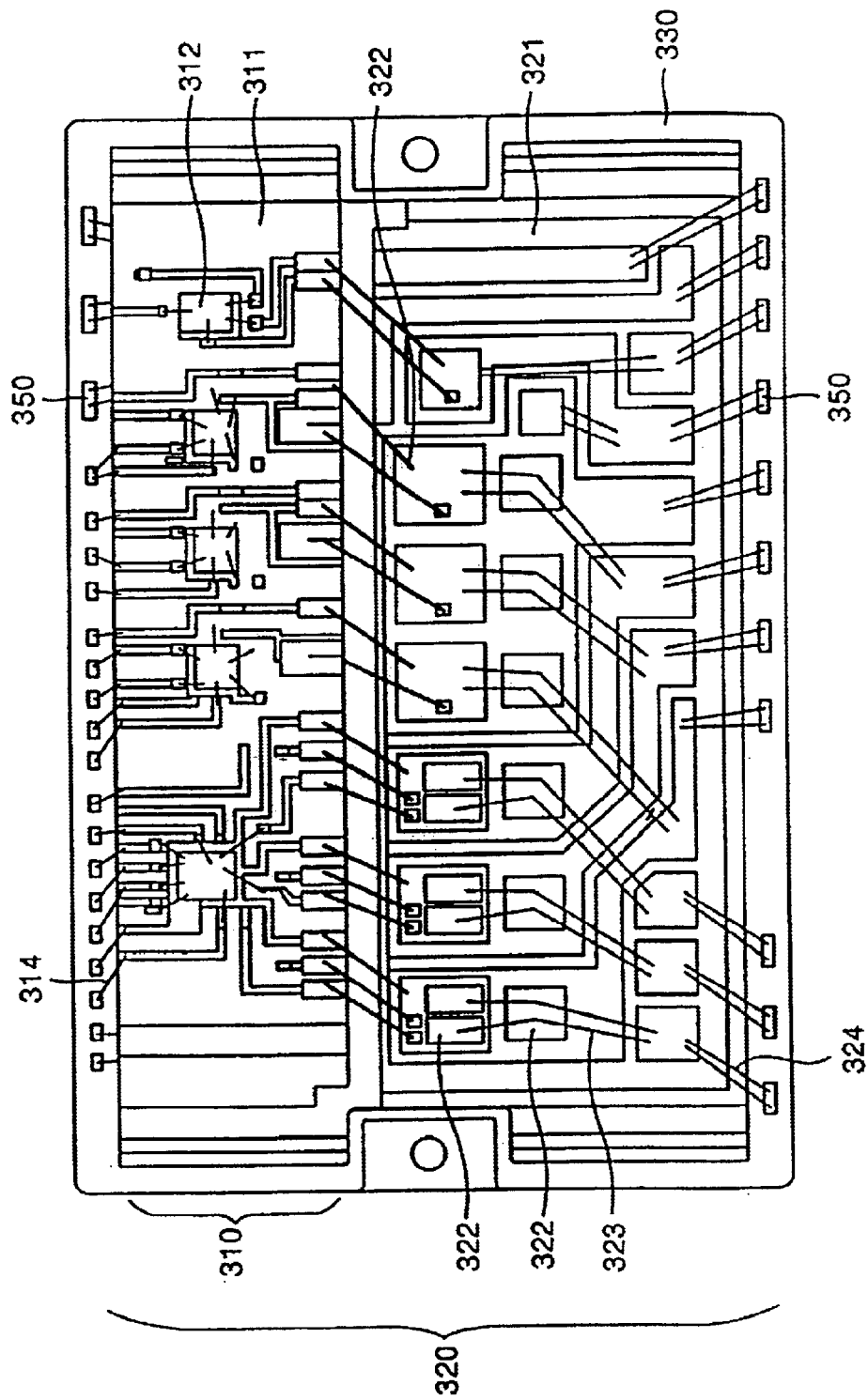
FIG. 12 is a view for explaining the steps 508 and 509 illustrated in FIG. 10.

Next, as shown in FIG. 12, the print circuit boards 311 are attached to the case 330 (step 508). The print circuit boards 311 are supported by the first and second bars 333 and 334 of FIG. 8, which are placed in the case 330, to be placed at predetermined intervals in the perpendicular direction, while being overlapped with a portion of the DBC substrate 321. Although not illustrated in the drawings, during the step 508 a silicone rubber is inserted into the top of the first and second bars 333 and 334 to attach the print circuit boards 311 to the case 330. In this case, it is possible to increase the adhesive strength between the print circuit boards 311 and the case 330 if grooves are formed at the top of the first and second bars 333 and 334. Then, the print circuit boards 311 are connected to the copper terminals 350, which are exposed within the case 330, via the wire 314 (step 509). Preferably, the wire 314 is an aluminum wire.

Then, as shown in FIG. 4, the silicone gel 360 is inserted, into the case 330 so as to protect the control circuit chip 312 and the power circuit chip 322 from environmental or thermal stress (step 510). Next, the cover 340 is attached to the top of the case 330 via an adhesive such as silicone adhesive, thereby encapsulating the top of the package 300 (step 511).

As described above, in a semiconductor power module according to the present invention, control circuit parts are spaced at a predetermined interval from a power circuit part while being overlapped with a portion of the power circuit part. Therefore, it is possible to reduce the size of the package occupying in a system. Also, it is possible to reduce manufacturing costs therefor. Also, the power circuit part and the control circuit part are connected to each other by a terminal inserted into the case via wires. Thus, no additional connections are required, and further, this semiconductor power module is easier to manufacture than conventional semiconductor power modules.

What is claimed is:

1. A semiconductor power module in which a power circuit chip and a control circuit chip are integrated in a package, the semiconductor power module comprising:
    a case;
    a terminal inserted into the case, the terminal including a portion protruding upward to the outside of the case, and a portion exposed in the case;
    a first substrate to which the power circuit chip is attached, the first substrate attached to the case and forming the bottom of the package;
    a second substrate to which the control circuit chip is attached, the second substrate spaced from the first substrate at a predetermined interval in a perpendicular direction an the case; and
    a cover for covering the top of the case, and forming the top of the package,
    wherein at least a portion of the terminal is inside a wall of the case.

2. The semiconductor power module of claim 1, wherein the case is made of a plastic material.

3. A semiconductor power module in which a power circuit chip and a control circuit chip are integrated in a package, the semiconductor power module comprising:
    a case;
    a terminal inserted into the case, the terminal including a portion protruding upward to the outside of the case, and a portion exposed in the case;
    a first substrate to which the power circuit chip is attached, the first substrate attached to the case and forming the bottom of the package;
    a second substrate to which the control circuit chip is attached, the second substrate spaced from the first substrate at a predetermined interval in a perpendicular direction in the case; and
    a cover for covering the top of the case, and forming the top of the package,
    wherein the terminal is made of copper material that is electroplated with nickel.

4. A semiconductor power module in which a power circuit chip and a control circuit chip are integrated in a package, the semiconductor power module comprising:
    a case;
    a terminal inserted into the case, the terminal including a portion protruding upward to the outside of the case, and a portion exposed in the case;
    a first substrate to which the power circuit chip is attached, the first substrate attached to the case and forming the bottom of the package;
    a second substrate to which the control circuit chip is attached, the second substrate spaced from the first substrate at a predetermined interval in a perpendicular direction in the case; and
    a cover for covering the toy of the case, and forming the top of the package,
    wherein the first substrate and the power circuit chip, and the first substrate and the control circuit chip are electrically connected to each other via wires, respectively.

5. The semiconductor power module of claim 4, wherein the wires, which connect the first substrate and the power circuit chip to each other, are aluminum wires, and the wires, which connect the second substrate and the control circuit chip to each other, are gold wires.

6. A semiconductor power module in which a power circuit chip and a control circuit chip are integrated in a package, the semiconductor power module comprising:
    a case;
    a terminal inserted into the case, the terminal including a portion protruding upward to the outside of the case, and a portion exposed in the case;
    a first substrate to which the power circuit chip is attached, the first substrate attached to the case and forming the bottom of the package;
    a second substrate to which the control circuit chip is attached, the second substrate spaced from the first substrate at a predetermined interval in a perpendicular direction in the case; and a cover for covering the top of the case, and forming the top of the package, wherein the first substrate and the power circuit chip are electrically connected to the exposed portions of the terminal via wires, respectively.

7. The semiconductor power module of claim 6, wherein the wires, which electrically connect the first substrate, and the power circuit chip to the exposed portions of the terminal, are aluminum wires.

8. The semiconductor power module of claim 2, wherein the fist substrate and the power circuit chip are electrically connected to the exposed portions of the terminal via wires, respectively.

9. A semiconductor power module in which a power circuit chip and a control circuit chip are integrated in a package, the semiconductor power module comprising:

a case;

terminal inserted into the case, the terminal including a portion protruding upward to the outside of the case, and a portion exposed in the case;

a first substrate to which the power circuit chip is attached, the first substrate attached to the case and forming the bottom of the package;

a second substrate to which the control circuit chip is attached, the second substrate spaced from the first substrate at a predetermined interval in a perpendicular direction in the case; and a cover for covering the top of the case, and forming the top of the package, wherein the second substrate and the exposed portions of the terminal are electrically connected to each other via wires.

10. The semiconductor power module of claim 9, wherein the wires, which connect the second substrate to the exposed portions of the terminal, are aluminum wires.

11. A semiconductor power module in which a power circuit chip and a control circuit chip are integrated in a package, the semiconductor power module comprising:

a case;

a terminal inserted into the case, the terminal including a portion protruding upward to the outside of the case, and a portion exposed in the case;

a first substrate to which the power circuit chip is attached, the first substrate attached to the case and forming the bottom of the package;

a second substrate to which the control circuit chip is attached, the second substrate spaced from the first substrate at a predetermined interval in a perpendicular direction in the case; and a cover for covering the top of the case, and forming the top of the package, wherein the first substrate is a stacked structure in which a copper layer, a ceramic layer and a copper layer are sequentially deposited.

12. A semiconductor power module in which a power circuit chip and a control circuit chip are integrated in a package, the semiconductor power module comprising:

a case;

a terminal inserted into the case, the terminal including a portion protruding upward to the outside of the case, and a portion exposed in the case;

a first substrate to which the power circuit chip is attached, the first substrate attached to the case and forming the bottom of the package;

a second substrate to which the control circuit chip is attached, the second substrate spaced from the first substrate at a predetermined interval in a perpendicular direction in the case; and a cover for covering the top of the case, and forming the top of the package, wherein the second substrate is a print circuit board.

13. A semiconductor power module in which a power circuit chip and a control circuit chip are integrated in a package, the semiconductor power module comprising;

a case;

a terminal inserted into the case, the terminal including a portion protruding upward to the outside of the case, and a portion exposed in the case;

a first substrate to which the power circuit chip is attached, the first substrate attached to the case and forming the bottom of the package;

a second substrate to which the control circuit chip is attached, the second substrate spaced from the first substrate at a predetermined interval in a perpendicular direction in the case; and a cover for covering the top of the case, and forming the top of the package, and wherein the package further comprises a silicone gel filling the inside of the package.

14. A semiconductor power module in which a power circuit chip and a control circuit chip are integrated in a package, the semiconductor power module comprising:

a case;

a terminal inserted into the case, the terminal including a portion protruding upward to the outside of the case, and a portion exposed in the case;

a first substrate to which the power circuit chip is attached, the first substrate attached to the case;

a second substrate to which the control circuit chip is attached, the second substrate spaced from the first substrate at a predetermined interval in a perpendicular direction in the case; and a cover for covering the top of the case, and forming the top of the package, wherein at least a portion of the terminal is inside a wall of the case.

* * * * *

UNITED STATES PATENT AND TRADEMARK OFFICE
CERTIFICATE OF CORRECTION

PATENT NO. : 6,774,465 B2
DATED : August 10, 2004
INVENTOR(S) : Lee et al.

It is certified that error appears in the above-identified patent and that said Letters Patent is hereby corrected as shown below:

Column 7,
Line 11, delete "fist" and substitute therefore, -- first --.

Signed and Sealed this

Nineteenth Day of April, 2005

JON W. DUDAS
*Director of the United States Patent and Trademark Office*